United States Patent [19]

Chadwick

[11] Patent Number: 4,908,532
[45] Date of Patent: Mar. 13, 1990

[54] QUADRATURE SIGNALS GENERATOR

[75] Inventor: Peter E. Chadwick, Wiltshire, United Kingdom

[73] Assignee: Plessey Overseas Limited, Ilford, United Kingdom

[21] Appl. No.: 195,640
[22] PCT Filed: Sep. 14, 1987
[86] PCT No.: PCT/GB87/00640
§ 371 Date: Jul. 8, 1988
§ 102(e) Date: Jul. 8, 1988
[87] PCT Pub. No.: WO88/02196
PCT Pub. Date: Mar. 24, 1988

[30] Foreign Application Priority Data

Sep. 16, 1986 [GB] United Kingdom ............... 8622293

[51] Int. Cl.⁴ ............................................. H03L 7/00
[52] U.S. Cl. ..................................... 307/512; 328/155
[58] Field of Search ............... 307/262, 497, 512; 328/155, 133; 331/22, 25

[56] References Cited

U.S. PATENT DOCUMENTS 3,614,475 10/1971 Deboo ............................. 307/262
4,021,740 5/1977 Horna ............................. 328/29
4,475,088 10/1984 Beard ............................. 307/512 X

FOREIGN PATENT DOCUMENTS 2335048 3/1974 Fed. Rep. of Germany .
1049818 9/1964 United Kingdom .
1343592 1/1974 United Kingdom .
1345274 1/1974 United Kingdom .
1401904 8/1975 United Kingdom .
2001217 1/1979 United Kingdom .

OTHER PUBLICATIONS

Proc. IEE, vol. 122, No. 9, Sep. 1975; D. Woods: "Passive Network as a Complex-Voltage Generator in Four Quadrants", pp. 947–950.

Primary Examiner—Brian S. Steinberger
Attorney, Agent, or Firm—Fleit, Jacobson, Cohn, Price, Holman & Stern

[57] ABSTRACT

A quadrature signal generator is provided which includes a voltage dependent resistance capacitance phase-shifting network (12) and a phase detector (26) for detecting any difference, from 90°, between the phases of the in-phase and quadrature phase signals (2, 24) generated by the network (12) and for producing a control signal in dependence upon such difference. The control signal is applied to the network (12) to vary the phase-shifting characteristic thereof to restore and maintain the 90° phase difference.

7 Claims, 1 Drawing Sheet

QUADRATURE SIGNALS GENERATOR

TECHNICAL FIELD

This invention relates to a quadrature signal generator. Apparatus such as phasing single side band generators, direct conversion receivers and some radar receiving systems require the production of "In-phase" and "Quadrature phase" channels (I and Q channels). The signals in the two channels have a 90° phase difference between them.

BACKGROUND ART

It is known to produce I and Q channel signals in various ways. For example, a known method uses a transmission line quadrature hybrid incorporating wound components which make it unsuitable for fabrication by integrated circuit technology. Alternatively, at ultra high frequencies (UHF), striplines may be used. Such hybrids suffer from the disadvantage in that they are, essentially, narrow band devices. A second known method uses a digital divider. However, as the divider employs digital techniques, it cannot handle quadrature phase shift at low levels or where the signal amplitudes vary to any great extent.

A further known method is that utilising a resistance-capacitance network to produce the required phase shift. Such a network is shown diagrammatically in FIG. 1 of the accompanying drawings. The network comprises two arms 10, a first arm containing a resistor $R_1$ and a capacitor $C_1$, and a second arm containing a resistor R2 and a capacitor $C_2$. Providing $R_1.C_1$ is equal to $C_2.R_2$, a signal applied at $V_{APP}$ will be split into two signal channels in quadrature phase, a first signal channel being advanced in phase by 45° and the second signal channel being retarded in phase by 45°. The values of the resistors $R_1$, $R_2$ and of the capacitors $C_1$, $C_2$ are chosen for the specific frequency of the applied signal. Although of low cost and offering an acceptable tolerance sensitivity (of the designed frequency), variations in the frequency of the applied signal cause relatively high losses in the network, and hence, it is essentially a narrow bandwidth device if the network loss is not to exceed 3 dB.

In general, quadrature signal generators have an accuracy tolerance which depends on the tolerance of the components forming the circuit. In integrated circuits, because of their small size, high accuracy of component values is extremely difficult to achieve.

DISCLOSURE OF THE INVENTION

It is an object of the present invention to provide a quadrature signal generator of low cost, suitable for fabrication by integrated circuit technology, which has an increased bandwidth without substantially increasing the losses involved or producing variations in the desired 90° phase difference.

According to the present invention, there is provided a quadrature signals generator, responsive to an applied input signal, for producing two phase-shifted output signals differing from each other by a relative phase of 90°;

said generator including a phase-shifting network, this network being interconnected between signal input and ground, and, having essentially a pair of arms each of which is comprised of a resistor, an output channel, and a capacitance element in series therewith;

said generator being characterised by:

a phase detector, having inputs connected to respective output channels of the network, responsive to any difference from 90° relative phase between said two output signals, to produce a control error signal; and, said capacitance elements being of variable type and arranged relative to said detector to allow variation of the capacitance in both network arms so to maintain the two output signals in quadrature relative phase.

INTRODUCTION OF THE DRAWINGS

The invention will be described further, by way of example, with reference to FIG. 2 of the accompanying drawing which is a schematic diagram of a quadrature signals generator according to the present invention.

DESCRIPTION OF A PREFERRED EMBODIMENT

Figure 1:
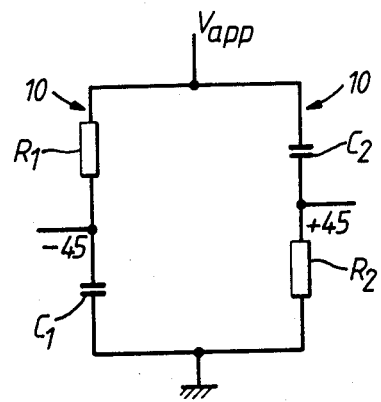
Figure 2:
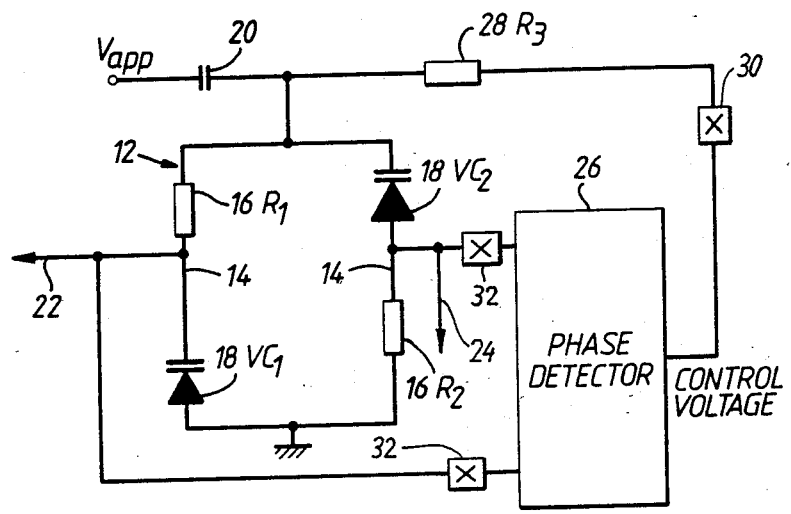

As shown in FIG. 2, the quadrature signals generator according to a preferred embodiment of the present invention employs a resistance-capacitance network 12 similar but not identical to the network shown in FIG. 1. In the network 12, two arms 14 each contain a resistor 16 and, in this case, a variable capacitance diode 18. The network 12 is connected to ground and to an applied signal source $V_{app}$ via an isolating capacitor 20.

Two output channels, an I (in-phase) channel 22 and a Q (quadrature phase) channel 24, provide the phase quadrature ouputs of the quadrature signal generator. The values of the resistances 16 and the diodes 18 are chosen such that, at mid range, for example, of the diodes, the frequency of the applied signal causes the generation of the 90° out of phase channels at the outputs.

The generator also includes a phase detector 26, coupled to the output channels 22 and 24, for producing a control signal in dependence upon any variation of the phase difference, from 90°, in the signals on the output channels 22 and 24. The control signal is attenuated, if necessary, by a resistor 28 and fed back to the network 12 as an appropriate DC bias. The magnitude and sign of the DC bias provided, relative to an operating point, effects a change in capacitance of the diodes 18 thereby altering the characteristics of the network 12 to vary the phase shift in a manner such as to restore the desired 90° phase difference.

If any shift in the frequency of the applied signal $V_{app}$ occurs, the phase detector 26 detects a shift from 90° of the phase difference between the output channels and generates an appropriate control signal to restore the network capacitance values so as automatically to maintain the two signal output channels 22, 24 in quadrature.

Additional bias may be applied to the control signal upon initially setting the network and this may be varied, for example, manually, for a known variation in applied signal frequency.

Appropriate DC amplification 30 may be employed, for example, to minimise any static error caused by offset in the phase detector 26. For low level analogue signals, amplifiers 32 may be provided between the network 12 and the phase detector 26.

It is to be understood that the invention is not confined to the precise details of the foregoing example and variations may be made thereto.

For example, variable capacitance diodes may be formed of silicon junctions but for very high frequency applied signals, gallium arsenide variable capacitance diodes are preferred.

It will be seen that the provision of voltage dependent elements in the network followed by a phase detector to generate a control voltage signal permits for automatic maintenance of the phase difference of 90° in a quadrature signals generator in accordance with the present invention without dependence upon exact values of components and in a manner which facilitates manufacture by integrated circuit fabrication techniques.

In the preferred embodiment above described, it is relatively simple to maintain the desired quadrature relationship with a frequency change in the applied signal over a 2:1 range.

I claim:

1. A quadrature signals generator, responsive to an applied input signal, for producing two phase-shifted output signals differing from each other by a relative phase of 90°;

said generator including a phase-shifting network being interconnected between signal input and ground, and, having a pair of arms each of which is comprised of a resistor, an output channel, and a capacitance element in series therewith;

said generator being characterized by:

a phase detector, having inputs connected to respective output channels of the network, responsive to any difference from 90° relative phase between said two output signals, to produce a control signal and, each capacitance elements being adjustable and arranged relative to said detector to allow variation of the capacitance in both network arms so to maintain the two output signals in quadrature relative phase.

2. A generator, as claimed in claim 1, wherein:

the capacitance elements are variable capacitance diodes; the phase detector is arranged to produce an error DC voltage signal; and, the phase detector output is connected to apply said DC voltage signal to the input of the network.

3. A generator, as claimed in claim 2, wherein an alternating resistor is interposed between the phase detector output and the input of the network.

4. A generator, as claimed in claim 2, wherein a DC amplifier is inserted between the phase detector output and the input of the network, for minimising static error arising from any offset in the phase detector.

5. A generator, as claimed in claim 1, wherein an amplifier is inserted, respectively, between each output channel of the network and the corresponding input of the phase detector.

6. A generator, as claimed in claim 1, wherein the network resistors and network capacitance elements, respectively, include elements that are matched to produce 45° lead and lag phase-shifts, respectively, between the output signals and the applied input signal.

7. A generator, as claimed in claim 1, wherein the network and phase detector are integrated circuits.

* * * * *